US011194951B1

(12) United States Patent
Burbine et al.

(10) Patent No.: US 11,194,951 B1
(45) Date of Patent: Dec. 7, 2021

(54) OPTICAL PROXIMITY CORRECTION MODEL VERIFICATION

(71) Applicant: Mentor Graphics Corporation, Wilsonville, OR (US)

(72) Inventors: Andrew Burbine, Rochester, NY (US); Germain Louis Fenger, Gladstone, OR (US)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 17/007,135

(22) Filed: Aug. 31, 2020

(51) Int. Cl.
 *G06F 30/33* (2020.01)
 *G06F 30/398* (2020.01)
 *G03F 1/36* (2012.01)
 *G06F 30/394* (2020.01)

(52) U.S. Cl.
 CPC .............. *G06F 30/398* (2020.01); *G03F 1/36* (2013.01); *G06F 30/33* (2020.01); *G06F 30/394* (2020.01)

(58) Field of Classification Search
 CPC .... G03F 7/70625; G03F 1/36; G03F 7/70441; G03F 7/70433; G03F 7/70283; G03F 7/70608; G03F 7/70425; G03F 7/70691; G03F 7/70258; G03F 7/202; G03F 7/705; G03F 9/7088; G03F 1/72; G06T 7/0006; G01B 11/272; G06F 30/367; G06F 30/20; G06F 30/398; G06F 30/392; G06F 2115/06; G06F 30/30; G06F 2119/18; G06F 30/39; G06F 7/70; G06F 17/18; G06F 2119/14; G06F 30/13; G06F 30/28; G06F 30/327; H01L 21/027; H01L 22/12
 USPC ...................................... 716/50–56
 See application file for complete search history.

(56) References Cited

U.S. PATENT DOCUMENTS

| 9,588,439 | B1 * | 3/2017 | Bruguier ................. G06F 30/20 |
| 2017/0363950 | A1 * | 12/2017 | Sriraman .............. G06F 30/398 |
| 2018/0157161 | A1 * | 6/2018 | Mailfert ................ G06F 30/367 |

\* cited by examiner

*Primary Examiner* — Binh C Tat

(57) ABSTRACT

A computing system implementing an optical proximity correction model verification tool can determine parameters for design patterns associated with an integrated circuit described in a layer file, and determine differences between the design patterns and calibration patterns utilized to calibrate an optical proximity correction (OPC) model configured to predict a printed image on a substrate corresponding to a layout design for the integrated circuit by determining distances between the determined parameters for the design patterns and parameters for the calibration patterns. The computing system can classify the design patterns with a modeling capability of the OPC model for the design patterns based on the differences between design patterns and the calibration patterns and possibly error rates of the OPC model associated with the calibration patterns or lithographic difficulty of the calibration patterns. The computing system can modify the layer file to include the classifications of the design patterns.

17 Claims, 4 Drawing Sheets

OPTICAL PROXIMITY CORRECTION MODEL VERIFICATION

TECHNICAL FIELD

This application is generally related to electronic design automation and, more specifically, to optical proximity correction model verification.

BACKGROUND

In a design flow for fabricating integrated circuits, a physical design of an integrated circuit can describe specific geometric elements, often referred to as a layout design. The geometric elements, which typically are polygons, define the shapes that will be created in various materials to manufacture the integrated circuit. Typically, a designer will select groups of geometric elements representing circuit device components, e.g., contacts, gates, etc., and place them in a design area. These groups of geometric elements may be custom designed, selected from a library of previously-created designs, or some combination of both. Once the groups of geometric elements representing circuit device components have been placed, geometric elements representing connection lines then are then placed between these geometric elements according to the predetermined route. These lines will form the wiring used to interconnect the electronic devices.

Descriptions for physical designs of integrated circuits can be provided in many different formats. The Graphic Data System II (GDSII) format is a popular format for transferring and archiving two-dimensional (2D) graphical circuit layout data. Among other features, it contains a hierarchy of structures, each structure containing layout elements (e.g., polygons, paths or polysilicon lines, circles and textboxes). Other formats include an open source format named Open Access, Milkyway, EDDM, and Open Artwork System Interchange Standard (OASIS). These various industry formats are used to define the geometrical information in layout designs that are employed to manufacture integrated circuits. Once the design is finalized, the layout portion of the design can be used by fabrication tools to manufacture the circuit using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask is created to expose only the desired areas to the radiation, and to protect the other areas from exposure. The mask is created from circuit layout data. That is, the geometric elements described in a layout design define the relative locations or areas of the circuit that will be exposed to radiation through the mask. A mask or reticle writing tool is used to create the mask based upon the layout design, after which the mask can be used in a photolithographic process.

As designers and manufacturers continue to increase the number of circuit components in a given area and/or shrink the size of circuit components, the shapes reproduced on the substrate (and thus the shapes in the mask) become smaller and are placed closer together. This reduction in feature size increases the difficulty of faithfully reproducing the image intended by the layout design onto the substrate. The diffractive effects of radition often result in defects where the intended image is not accurately printed onto the substrate during the photolithographic process, creating flaws in the manufactured device. One or more resolution enhancement techniques (RETs) are often employed to improve the resolution of the image that the mask forms on the substrate during the photolithographic process.

One of these techniques—optical proximity correction (OPC)—adjusts the amplitude of the radiation transmitted through a lithographic mask by modifying the mask layout design data employed to create the mask. For example, edges in the mask layout design may be adjusted to make certain portions of the geometric elements larger or smaller, in accordance with how much additional radiation exposure (or lack of exposure) is desired at certain points on the substrate. When these adjustments are appropriately calibrated, overall pattern fidelity can be increased.

A specific form of optical proximity correction, called model-based optical proximity correction, can utilize the mask layout design data along with an optical proximity correction model, such as an OPC compact resist model, to predict a printed image on a substrate resulting from the radiation exposure through one or more masks described by the mask layout design data and then modify the mask layout design data. The accuracy of the model-based optical proximity correction often depends on the accuracy of the OPC model. When the OPC model is inaccurate, the OPC process may introduce errors into the mask layout design data that could be used to manufacture a faulty integrated circuit. Often, however, integrated circuit manufacturers will continue to test the accuracy of the OPC model after calibration to identify any design patterns that the OPC model predicts inaccurately and to either re-calibrate the OPC model or implement other techniques to compensate for the inaccuracy of the OPC model.

SUMMARY

This application discloses a computing system implementing an optical proximity correction (OPC) model verification tool to determine parameters for design patterns associated with an integrated circuit described in a layer file, and determine differences between the design patterns and calibration patterns utilized to calibrate an optical proximity correction (OPC) model configured to predict a printed image on a substrate corresponding to a layout design for the integrated circuit by determining distances between the determined parameters for the design patterns and parameters for the calibration patterns. The computing system can classify the design patterns with a modeling capability of the OPC model for the design patterns based on the differences between design patterns and the calibration patterns and possibly error rates of the OPC model associated with the calibration patterns or lithographic difficulty of the calibration patterns. The computing system can modify the layer file to include the classifications of the design patterns, which can be utilized to perform a number of corrective actions, such as re-calibrating the OPC model with calibration patterns identified using the classifications of the design patterns, re-performing an OPC process on a mask layout design for the integrated circuit, analyzing portions of a taped-out mask identified by the classifications, or the like. Embodiments of will be described below in greater detail.

DETAILED DESCRIPTION

Illustrative Operating Environment

Figure 1:
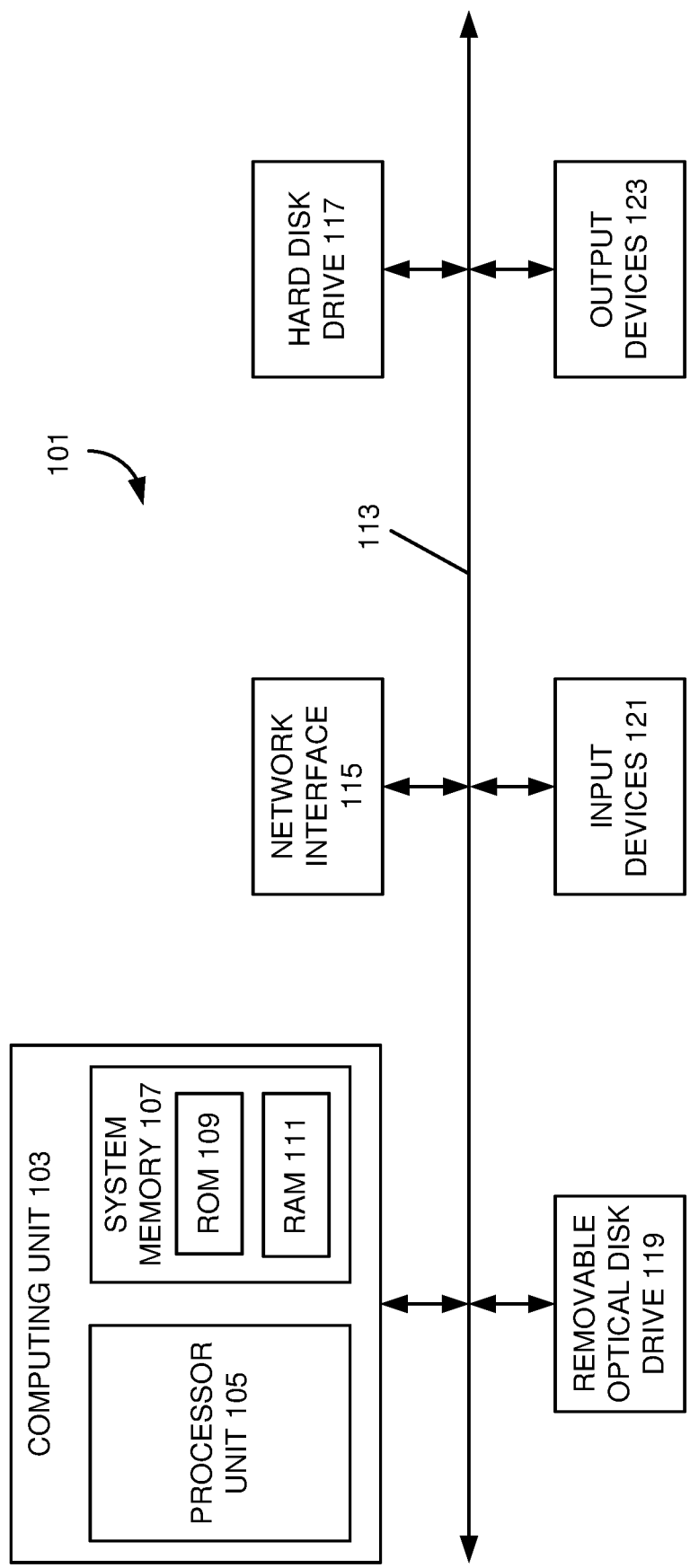
FIGS. 1 and 2 illustrate an example of a computer system of the type that may be used to implement various embodiments.

Various examples may be implemented through the execution of software instructions by a computing device 101, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices 115-123. For example, the processing unit 105 or the system memory 107 may be directly or indirectly connected to one or more additional memory storage devices, such as a hard disk drive 117, which can be magnetic and/or removable, a removable optical disk drive 119, and/or a flash memory card. The processing unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 115-123 may be internally housed with the computing unit 103. Alternately, one or more of the peripheral devices 115-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments may be implemented using a multi-processor computer, a plurality of single and/or multiprocessor computers arranged into a network, or some combination of both.

Figure 2:
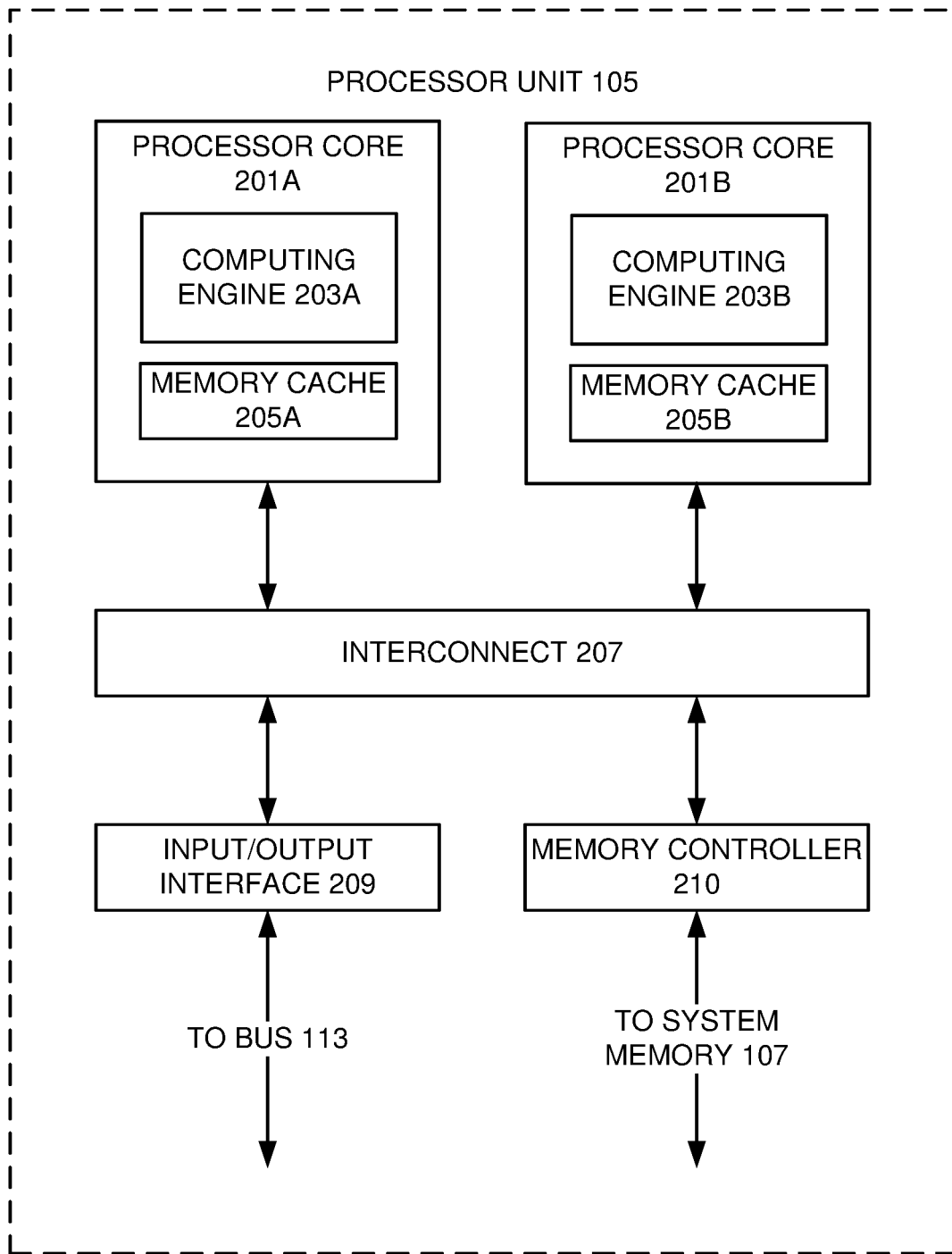

With some implementations, the processor unit 105 can have more than one processor core. Accordingly, FIG. 2 illustrates an example of a multi-core processor unit 105 that may be employed with various embodiments. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, Calif., the interconnect 207 may be implemented as a system request interface device. In any case, the processor cores 201A and 201B communicate through the interconnect 207 with an input/output interface 209 and a memory controller 210. The input/output interface 209 provides a communication interface to the bus 113. Similarly, the memory controller 210 controls the exchange of information to the system memory 107. With some implementations, the processor unit 105 may include additional components, such as a high-level cache memory accessible shared by the processor cores 201A and 201B. It also should be appreciated that the description of the computer network illustrated in FIG. 1 and FIG. 2 is provided as an example only, and it not intended to suggest any limitation as to the scope of use or functionality of alternate embodiments.

Optical Proximity Correction Model Verification

Figure 3:
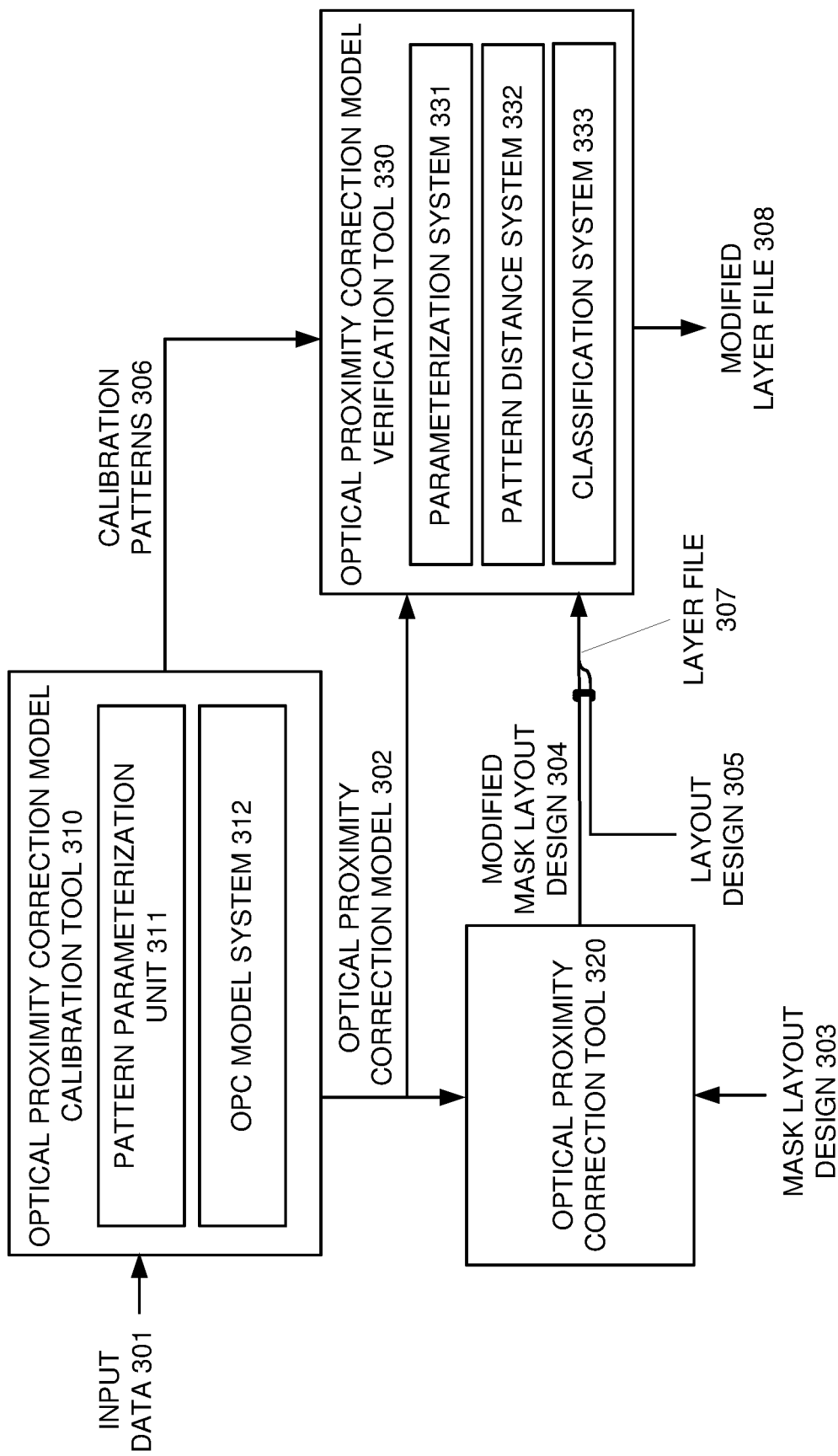
FIG. 3 illustrates an example of an optical proximity correction (OPC) calibration tool, an OPC tool, and an OPC model verification tool to perform parameter-based verification of the OPC model according to various embodiments.
Figure 4:
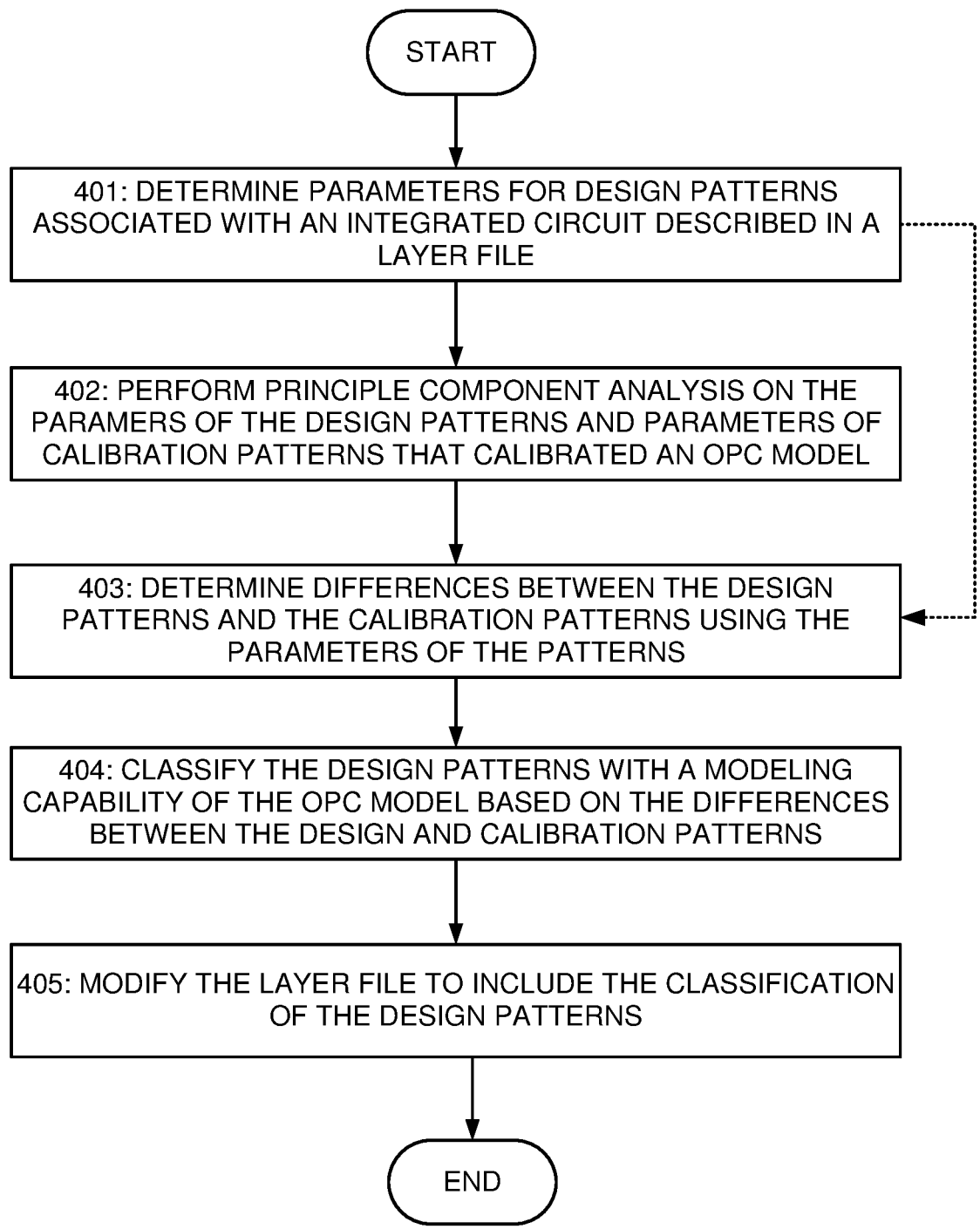
FIG. 4 illustrates a flowchart showing example parameter-based optical proximity correction (OPC) model verification according to various examples.

FIG. 3 illustrates an example of an optical proximity correction (OPC) calibration tool 310, an OPC tool 320, and an OPC model verification tool 330 to perform parameter-based verification of the optical proximity correction (OPC) model according to various embodiments. FIG. 4 illustrates a flowchart showing example parameter-based OPC model verification according to various examples. Referring to FIGS. 3 and 4, the OPC model calibration tool 300, for example, implemented by the computing device 101 in FIG. 1, can receive input data 301 including measurements collected during optical lithographic experiments for different features on a wafer, for example, performed by a foundry at a manufacturing process node. The input data 301, for example, formatted in a text file, can identify the feature that was measured, the location of the feature on the wafer, one or more measurements related to the feature, such as a one-dimensional width, pitch, or critical dimension, or the like. In some embodiments, the input data 301 can include a filtered version of the measurements, for example, having the outlier measurements removed.

In some embodiments, the OPC model calibration tool 300 can generate a gauge file from the input data 301. The OPC model calibration tool 300 can determine gauges from the measurements of features in the input data 301 and then combine the gauges into the gauge file. In some embodiments, the OPC model calibration tool 300 can identify features in the input data 301 that are the same or similar, and then aggregate the measurement values for the identified features, for example, by averaging them, to determine the gauge for the identified features. In some examples, a gauge can represent a set of similar features of an integrated circuit and include an aggregated measurement value to associate with those features.

The OPC model calibration tool 300 can include a parameterization unit 311 that can convert the gauges in the gauge file into feature vectors with parameterized measurement values or calibration patterns 306. The parameterized measurements can include values corresponding to geometric properties, kernel properties, resist model properties, etch model properties, intensity value properties, or the like, for the gauges. In some embodiments, the feature vectors can include over 60 different parameterized measurements for the gauges.

The OPC model calibration tool 300 can include an OPC model system 312 to calibrate an optical proximity correction model 302 based on calibration patterns 306 corresponding to the parameterized gauges in the gauge file. In some embodiments, the OPC model system 312 can utilize the calibration patterns 306 to alter an operation of a cost function in the optical proximity correction model 302. For example, the cost function in the optical proximity correction model 302 can utilize weights derived from parameterized gauges in the gauge file to favor smaller errors for gauges with higher weights and vice versa.

The optical proximity correction model 302 calibrated by the OPC model calibration tool 300 can be utilized by downstream design and analysis tools, such as an optical proximity correction tool 320, a design verification tool, a mask or reticle writing tool, or the like. In this example, the optical proximity correction tool 320, for example, implemented by the computing device 101 in FIG. 1, can receive the optical proximity correction model 302 from the OPC model calibration tool 300 and perform model-based optical proximity correction on a mask layout design 303 associated with a layout design 305 describing the integrated circuit to generate a modified mask layout design 304. The mask design layout 303 can describe a lithographic mask having a pattern that allows portions of a material layer to be exposed to radiation or light during a photolithographic process for a fabrication of the integrated circuit. The lithographic mask can be generated from mask design layout 303, for example, with a reticle writing tool, which can enable fabrication of a target wafer image corresponding to a layout design of the integrated circuit.

The optical proximity correction tool 320 can utilize the mask layout design 303 along with an optical proximity correction model 302 to predict a printed image on a substrate resulting from the radiation or light exposure through one or more masks described by the mask layout design 303. The optical proximity correction tool 320 can compare the prediction of the printed image to a target image for the integrated circuit, for example, described in the layout design 305 of the integrated circuit, and modify the mask layout design 303, for example, by adjusting the mask design layout 303 to alter an amplitude of radiation or light transmitted through a mask generated by the mask design layout 303 and increase overall pattern fidelity printed on the integrated circuit.

The OPC model verification tool 330, for example, implemented by the computing device 101 in FIG. 1, can receive a layer file 307 including a modified mask layout design 304 generated by the optical proximity correction tool 320 and the layout design 305 describing the integrated circuit. The layout design 305 can define geometrical information capable of being utilized to manufacture the integrated circuit, which can be specified in a Graphic Data System II (GDSII) format, an Open Access format, a Milkyway format, an EDDM format, an Open Artwork System Interchange Standard (OASIS) format, or the like. The OPC model verification tool 330 also can receive the calibration patterns 306 having the parameterized gauges from the OPC model calibration tool 310.

The OPC model verification tool 330 can include a parameterization system 331 that, in a block 401, can determine parameters for design patterns in the layer file 307, such as mask patterns in the modified mask layout design 304 or layout patterns in the layout design 305 of the integrated circuit. In some embodiments, the parameterization system 331 can convert the design patterns in the layer file 307 into feature vectors with parameterized measurement values. The parameterized measurements can include values corresponding to geometric properties, kernel properties, resist model properties, etch model properties, intensity value properties, or the like, for the design patterns. In some embodiments, the feature vectors can include over 60 different parameterized measurements for the design patterns.

In some embodiments, the parameterization system 331, in a block 402, can perform a principal component analysis (PCA) on the parameters of the design patterns and the parameters of the calibration patterns 306, which can reduce a dimensionality of the parameterized calibration patterns and the parameterized design patterns.

The OPC model verification tool 330 can include a pattern distance system 332 that, in a block 403, can determine differences between the calibration patterns 306 and the design patterns in the layer file 307, for example, using the parameters of gauges in the calibration patterns 306 and the parameters for the design patterns determined by the parameterization system 331. The pattern distance system 332 can compare the parameters for the calibration patterns 306 to parameters for each of the design patterns to ascertain a group of one or more calibration patterns 306 closest to each of the design patterns in the layer file 307. In some embodiments, the pattern distance system 332 can compare the reduced-dimensionality of parameters for the calibration patterns 306 and the design patterns to ascertain a group of one or more calibration patterns 306 closest to each of the design patterns in the layer file 307.

Since the OPC model 302 can be calibrated by the OPC model calibration tool 310 with a finite set of calibration patterns 306, the OPC model 302 can be well calibrated for some design patterns, for example, similar to the calibration patterns 306, and the OPC model 302 can be poorly calibrated for other design patterns, for example, not similar to the calibration patterns 306. By determining differences between the design patterns and the calibration patterns 306 using the parameters of the design patterns and the calibration patterns 306, the OPC model verification tool 330 can identify a relative similarly between the calibration patterns 306 used to calibrate the OPC model 302 and the design patterns in the layer file 307.

The OPC model verification tool 330 can include a classification system 333 that, in a block 404, can classify the design patterns in the layer file 307 with a modeling capability of the OPC model 302 based on the determine differences between the calibration patterns 306 and the design patterns in the layer file 307. For example, when a design pattern has a difference with the calibration patterns 306 within a threshold distance, the design pattern can be classified as well modeled by the OPC model 302. For a design pattern well modeled by the OPC model 302, there can be a lower risk that OPC tool 320 would generate the modified mask layout design 304 incorrectly due to the OPC model 302. When a design pattern has a difference with the calibration patterns 306 that falls outside of a threshold distance, the design pattern can be classified as poorly modeled by the OPC model 302. For a design pattern poorly modeled by the OPC model 302, there can be a higher risk that OPC tool 320 would generate the modified mask layout design 304 incorrectly due to the OPC model 302. In some embodiments, the design patterns that fall outside of the threshold distance can have other classifications based on a distance outside of the threshold distance that the design patterns fall.

The classification system 333, in some embodiments, can individually set the distance threshold for each of the calibration patterns 306 based on distances to other calibration patterns 306, an error rate of the OPC model 302 associated with the calibration patterns 306, a lithographic difficulty associated with the design patterns and different calibration patterns 306, or the like. For example, when the OPC model 302 has a high lithographic difficulty corresponding to a particular calibration pattern 306, the classification system 333 can reduce the threshold distance used to classify design patterns relative to when a calibration pattern has a medium error rate or a low error rate.

The classification system 333 may determine a level of a lithographic difficulty associated with design patterns based on one or more of a mask error enhancement factor (MEEF), an image log slope (ILS) or contrast, a combination thereof, or the like. For example, when a design pattern has a high MEEF value and/or a low ILS value, the classification system 333 can deem the design pattern to be difficult to manufacture through a lithographic process and thus reduce the threshold distance used to classify design patterns relative to when a calibration pattern have intermediate or lower MEEF values and/or intermediate or higher ILS values. The classification system 333, in some embodiments, can utilize a sliding scale for the distance threshold based on the values of one or more of the MEEF, the ILS, contrast, or the like.

In some embodiments, the classification system 333 can cluster or group the calibration patterns 306 based on their parameters to define regions in the parameter-dimensional space for each of the clusters or groups. The size of the regions can correspond to a number and locations of the calibration patterns 306 clustered to form a region, a relative distance between the clustered calibration patterns, the OPC error rates associated with the calibration patterns 306 in the cluster, the lithographic difficulty associated with the calibration patterns 306 in the cluster, or the like. For example, a cluster of calibration patterns 306 having low OPC error rates and low lithographic difficulty can have a larger region than a cluster of calibration patterns 306 having high OPC error rates and high lithographic difficulty. In some embodiments, the classification system 333 also can define other regions in the parameter-dimensional space having no calibration parameters 306, calibration parameters 306 having high OPC error rates, and/or having a high lithographic difficulty.

The classification system 333 can classify the design patterns in the layer file based on whether the parameters corresponding to the design patterns fall within one or more of the defined regions. For example, those design patterns that only fall inside region(s) defined by clusters of calibration patterns 306 can be classified as well modeled by the OPC model 302. In some embodiments, the classification system 333 can classify the design patterns that only fall in the other regions as poorly modeled by the OPC model 302. The classification system 333 can classify the design patterns that fall with both region defined by clusters of calibration patterns 306 and one of the other regions as ambiguously modeled by the OPC model 302. When a design pattern falls outside of all defined regions, the classification system 333 can categorize the design patterns as having an unknown modeling by the OPC model 302.

The classification system 333, in a block 405, can modify the layer file 307 to include one or more of the classifications of the design patterns. In some embodiments, the classification system 333 can include all of the classifications of the design patterns in a modified layer file 308 or include one or more of the classifications corresponding to design patterns having a higher risk of being manufactured with a fault, such as a pinch fault or a bridge fault, due to the performance of the OPC process with the OPC model 302.

The modified layer file 308 can be utilized by design engineers to re-calibrate the OPC model using new measurement data corresponding to the design patterns classified as higher risk. The re-calibrated OPC model can be utilized to in an OPC process by the OPC tool 320 to adjust the mask layout design 303 or the modified mask layout design 304. In some embodiments, the modified layer file 308 can be utilized to select a different OPC model to utilize to adjust the mask layout design 303 during the optical proximity correction process by the OPC tool 320.

When a mask has already been taped-out, the modified layer file 308 can be utilized to identify locations in the mask to inspect to determine that those portions of the mask can be utilized to form the integrated circuit without fault. The modified layer file 308 also can be utilized to identify locations to perform other corrective actions, such as re-targeting of the mask layout design or the like.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
   Performing, by a computing system, optical proximity correction (OPC) using a mask layout design and an optical proximity correction model to predict a printed image on a substrate corresponding to a layout design for an integrated circuit and to modify the mask layout design based on the predicted printed image;
   determining, by the computing system, differences between design patterns associated with the integrated circuit described in a layer file and calibration patterns utilized to calibrate the OPC, wherein the layer file includes both the layout design for the integrated circuit and the modified mask layout design;
   classifying, by the computing system, the design patterns with a modeling capability of the OPC model for the design patterns based, at least in part, on the differences between design patterns and the calibration patterns by utilizing parameters of the calibration patterns to identify clusters of the calibration patterns having corresponding regions of parameter values, and classifying the design patterns based, at least in part, on whether parameters of the design patterns fall within the regions of parameter values corresponding to the clusters of the calibration patterns; and
   modifying, by the computing system, the layer file to include the classifications of the design patterns.

2. The method of claim 1, further comprising determining, by the computing system, parameters for the design patterns associated with the integrated circuit described in the layer file, wherein determining the differences between the design patterns and the calibration patterns further comprises determining distances between the determined parameters for the design patterns and parameters for the calibration patterns.

3. The method of claim 2, further comprising reducing, by the computing system, a dimensionality of the parameters for the calibration patterns and the parameters for the design patterns using a principal component analysis, wherein determining the differences between the design patterns and the calibration patterns further comprises determining distances between reduced-dimensionality parameters for the design patterns and reduced-dimensionality parameters for the calibration patterns.

4. The method of claim 1, wherein classifying the design patterns with the modeling capability of the OPC model for the design patterns is based on the differences between design patterns and the calibration patterns and at least one of error rates of the OPC model associated with the calibration patterns or lithographic difficulty of the calibration patterns.

5. The method of claim 1, further comprising re-calibrating the OPC model using one or more calibration patterns corresponding to the design patterns classified in the layer file.

6. The method of claim 1, wherein the design patterns in the layer file correspond to patterns in the layout design for the integrated circuit or patterns in a mask layout design generated, in part, using the OPC model.

7. A system comprising:
a memory system configured to store computer-executable instructions; and
a computing system, in response to execution of the computer-executable instructions, is configured to:
perform optical proximity correction (OPC) using a mask layout design and an optical proximity correction model to predict a printed image on a substrate corresponding to a layout design for an integrated circuit and to modify the mask layout design based on the predicted printed image;
determine differences between design patterns associated with the integrated circuit described in a layer file and calibration patterns utilized to calibrate the OPC, wherein the layer file includes both the layout design for the integrated circuit and the modified mask layout design;
classify the design patterns with a modeling capability of the OPC model for the design patterns based, at least in part, on the differences between design patterns and the calibration patterns by utilizing parameters of the calibration patterns to identify clusters of the calibration patterns having corresponding regions of parameter values, and classifying the design patterns based, at least in part, on whether parameters of the design patterns fall within the regions of parameter values corresponding to the clusters of the calibration patterns; and
modify the layer file to include the classifications of the design patterns.

8. The system of claim 7, wherein the computing system, in response to execution of the computer-executable instructions, is further configured to:
determine parameters for the design patterns associated with the integrated circuit described in the layer file; and
determine the differences between the design patterns and the calibration patterns by determining distances between the determined parameters for the design patterns and parameters for the calibration patterns.

9. The system of claim 8, wherein the computing system, in response to execution of the computer-executable instructions, is further configured to:
reduce a dimensionality of the parameters for the calibration patterns and the parameters for the design patterns using a principal component analysis; and
determine the differences between the design patterns and the calibration patterns by determining distances between reduced-dimensionality parameters for the design patterns and reduced-dimensionality parameters for the calibration patterns.

10. The system of claim 7, wherein the computing system, in response to execution of the computer-executable instructions, is further configured to classify the design patterns with the modeling capability of the OPC model for the design patterns based on the differences between design patterns and the calibration patterns and at least one of error rates of the OPC model associated with the calibration patterns or lithographic difficulty of the calibration patterns.

11. The system of claim 7, wherein the computing system, in response to execution of the computer-executable instructions, is further configured to re-calibrate the OPC model using one or more calibration patterns corresponding to the design patterns classified in the layer file.

12. An apparatus comprising at least one computer-readable memory device storing instructions configured to cause one or more processing devices to perform operations comprising:
performing optical proximity correction (OPC) using a mask layout design and an optical proximity correction model to predict a printed image on a substrate corresponding to a layout design for an integrated circuit and to modify the mask layout design based on the predicted printed image;
determining differences between design patterns associated with the integrated circuit described in a layer file and calibration patterns utilized to calibrate the OPC, wherein the layer file includes both the layout design for the integrated circuit and the modified mask layout design;
classifying the design patterns with a modeling capability of the OPC model for the design patterns based, at least in part, on the differences between design patterns and the calibration patterns by utilizing parameters of the calibration patterns to identify clusters of the calibration patterns having corresponding regions of parameter values, and classifying the design patterns based, at least in part, on whether parameters of the design patterns fall within the regions of parameter values corresponding to the clusters of the calibration patterns; and
modifying the layer file to include the classifications of the design patterns.

13. The apparatus of claim 12, wherein the instructions are configured to cause one or more processing devices to perform operations further comprising determining parameters for the design patterns associated with the integrated circuit described in the layer file, wherein determining the differences between the design patterns and the calibration patterns further comprises determining distances between the determined parameters for the design patterns and parameters for the calibration patterns.

14. The apparatus of claim 13, wherein the instructions are configured to cause one or more processing devices to perform operations further comprising reducing a dimensionality of the parameters for the calibration patterns and the parameters for the design patterns using a principal component analysis, wherein determining the differences between the design patterns and the calibration patterns further comprises determining distances between reduced-dimensionality parameters for the design patterns and reduced-dimensionality parameters for the calibration patterns.

15. The apparatus of claim 12, wherein classifying the design patterns with the modeling capability of the OPC model for the design patterns is based on the differences between design patterns and the calibration patterns and at least one of error rates of the OPC model associated with the calibration patterns or lithographic difficulty of the calibration patterns.

16. The apparatus of claim 12, wherein the instructions are configured to cause one or more processing devices to perform operations further comprising re-calibrating the OPC model using one or more calibration patterns corresponding to the design patterns classified in the layer file.

17. The apparatus of claim 12, wherein the design patterns in the layer file correspond to patterns in the layout design for the integrated circuit or patterns in a mask layout design generated, in part, using the OPC model.

* * * * *